United States Patent
Crupnicoff et al.

(10) Patent No.: US 9,424,214 B2
(45) Date of Patent: Aug. 23, 2016

(54) NETWORK INTERFACE CONTROLLER WITH DIRECT CONNECTION TO HOST MEMORY

(71) Applicant: MELLANOX TECHNOLOGIES LTD., Yokneam (IL)

(72) Inventors: Diego Crupnicoff, Buenos Aires (AR); Todd Wilde, Palo Alto, CA (US); Richard Graham, Knoxville, TN (US); Michael Kagan, Zichron Yaakov (IL)

(73) Assignee: Mellanox Technologies Ltd., Yokneam (IL)

( * ) Notice: Subject to any disclaimer, the term of this patent is extended or adjusted under 35 U.S.C. 154(b) by 453 days.

(21) Appl. No.: 14/033,470

(22) Filed: Sep. 22, 2013

(65) Prior Publication Data

US 2014/0095753 A1 Apr. 3, 2014

Related U.S. Application Data

(60) Provisional application No. 61/706,769, filed on Sep. 28, 2012.

(51) Int. Cl.
*G06F 13/36* (2006.01)
*G06F 13/28* (2006.01)
*G06F 13/40* (2006.01)

(52) U.S. Cl.
CPC .............. *G06F 13/28* (2013.01); *G06F 13/36* (2013.01); *G06F 13/4068* (2013.01)

(58) Field of Classification Search
USPC ........... 710/22, 38, 300, 105, 305, 308, 316, 710/317
See application file for complete search history.

(56) References Cited

U.S. PATENT DOCUMENTS

| | | | |
|---|---|---|---|
| 8,051,212 B2 | 11/2011 | Kagan et al. | |
| 8,433,770 B2 * | 4/2013 | Noya et al. | 709/212 |
| 8,917,595 B2 | 12/2014 | Shah et al. | |
| 2004/0073716 A1 * | 4/2004 | Boom et al. | 709/250 |
| 2007/0283054 A1 * | 12/2007 | Burton | 710/22 |
| 2011/0029650 A1 | 2/2011 | Shah | |
| 2011/0246597 A1 * | 10/2011 | Swanson et al. | 709/212 |
| 2011/0295967 A1 * | 12/2011 | Wang et al. | 709/212 |
| 2014/0089631 A1 * | 3/2014 | King | 711/207 |
| 2014/0173154 A1 | 6/2014 | Sunkavalli et al. | |

* cited by examiner

*Primary Examiner* — Khanh Dang
(74) *Attorney, Agent, or Firm* — D. Kliger IP Services Ltd.

(57) ABSTRACT

A network interface device for a host computer includes a network interface, configured to transmit and receive data packets to and from a network. Packet processing logic transfers data to and from the data packets transmitted and received via the network interface by direct memory access (DMA) from and to a system memory of the host computer. A memory controller includes a first memory interface configured to be connected to the system memory and a second memory interface, configured to be connected to a host complex of the host computer. Switching logic alternately couples the first memory interface to the packet processing logic in a DMA configuration and to the second memory interface in a pass-through configuration.

21 Claims, 2 Drawing Sheets

NETWORK INTERFACE CONTROLLER WITH DIRECT CONNECTION TO HOST MEMORY

CROSS-REFERENCE TO RELATED APPLICATIONS

This application claims the benefit of U.S. Provisional Patent Application 61/706,769, filed Sep. 28, 2012, which is incorporated herein by reference.

FIELD OF THE INVENTION

The present invention relates generally to computer systems, and particularly to devices and methods for interfacing between a host computer and a packet data network.

BACKGROUND

Modern data centers and high-performance computing systems use multiple servers linked together by a high-speed switching fabric, such as Ethernet® or InfiniBand®. The introduction of multiple-core servers, as well as high performance requirements in various application areas, have driven an ever-increasing demand for greater bandwidth and reduced latency in communication among the servers.

The servers (also referred to as host computers, or simply hosts) connect to the network via a network interface controller (NIC, also referred to as a network interface adapter). The NIC is typically capable of sending and receiving packets over the network, under control of the operating system and applications running on the host, while reading and writing the packet payload data directly from and to the system memory of the host computer. The NIC typically interfaces to the host complex and system memory via an input/output (I/O) expansion bus, such as the ubiquitous PCI Express® (Peripheral Component Interconnect Express) bus. Thus, each read or write operation performed by the NIC from or to the system memory involves at least one bus transaction, and frequently multiple bus transactions.

SUMMARY

Embodiments of the present invention that are described hereinbelow provide improved systems, devices and methods for data communications among host computers.

There is therefore provided, in accordance with an embodiment of the present invention, a network interface device for a host computer. The device includes a network interface, configured to transmit and receive data packets to and from a network. Packet processing logic is configured to transfer data to and from the data packets transmitted and received via the network interface by direct memory access (DMA) from and to a system memory of the host computer. A memory controller includes a first memory interface configured to be connected to the system memory, a second memory interface, configured to be connected to a host complex of the host computer, and switching logic, which alternately couples the first memory interface to the packet processing logic in a DMA configuration and to the second memory interface in a pass-through configuration.

In a disclosed embodiment, the system memory includes dynamic random access memory (DRAM), and the first and second memory interface are Double Data Rate (DDR) interfaces. Typically, the switching logic is configured, in the pass-through configuration, as a transparent channel, whereby the host complex accesses addresses in the system memory as though the system memory was connected directly to the host complex.

In some embodiments, the device includes a host interface, which is configured to exchange traffic with the host complex via an expansion bus of the host computer, which is separate from the second memory interface. Typically, the expansion bus may include a peripheral component interconnect (PCI) bus. The traffic exchanged with the host complex via the expansion bus typically includes instructions to the packet processing logic with respect to the data packets that are transmitted to and received from the network. Additionally or alternatively, the traffic exchanged with the host complex via the expansion bus includes transactions on the expansion bus that are initiated by the memory controller in order to maintain cache coherency between the host complex and the system memory.

There is also provided, in accordance with an embodiment of the present invention, a computer system, including a system memory, a host complex, and a network interface controller (NIC), as described above.

There is additionally provided, in accordance with an embodiment of the present invention, a method for data communications, which includes connecting a first memory interface of a network interface controller (NIC) to a system memory of a host computer, and connecting a second memory interface of the NIC to a host complex of the host computer. Data packets are transmitted and received to and from a network via a network interface of the NIC while transferring data, via packet processing logic in the NIC, to and from the data packets by direct memory access (DMA) between the packet processing logic and the system memory. The first memory interface is alternately coupled to the packet processing logic in a DMA configuration to enable transfer of the data between the packet processing logic and the system memory, and to the second memory interface in a pass-through configuration to enable direct data transfer between the host complex and the system memory. The present invention will be more fully understood from the following detailed description of the embodiments thereof, taken together with the drawings in which:

DETAILED DESCRIPTION OF EMBODIMENTS

Although the speed of I/O expansion buses, such as the PCI Express bus, has increased in recent years, the bus may still be a bottleneck in applications requiring high-throughput, low-latency data transfers across a network. The direct memory connection between the host complex and the system memory (which is typically implemented in dynamic random access memory—DRAM—with a standard memory interface) is still capable of considerably higher data transfer rates than a NIC can achieve via the PCI Express bus.

Embodiments of the present invention that are described hereinbelow enable data transfer between a host computer and a network with data transfer bandwidth and reduced latency, by coupling the network interface device of the host computer directly to the system memory, rather than via an expansion bus. In the disclosed embodiments, the network interface device comprises (as in NICs that are known in the art) a network interface and packet processing logic, which transfers data to and from the data packets by direct memory access (DMA) from and to the system memory of the host computer. Unlike existing NICs, however, the network interface device also comprises a memory controller, having one memory interface that is connected directly to the system memory and another memory interface connected to the host complex of the host computer. Switching logic in the memory controller alternately couples the memory interface of the system memory either to the packet processing logic, in a DMA configuration, or to the memory interface of the host complex in a pass-through configuration.

In other words, in contrast to accepted NIC configurations, the network interface device in embodiments of the present invention is coupled between the host complex and the system memory. Typically, the switching logic is configured, in the pass-through configuration, to act as a transparent channel. Consequently, in this configuration, the host complex is able to access addresses in the system memory as though the system memory was connected directly to the host complex, with only minimal added latency due to the intervening switching logic. On the other hand, in the DMA configuration, the packet processing logic is able to exploit the full bandwidth and low latency of the direct interface to the system memory, without the limitations inherent in data transfer via the PCI Express or other expansion bus.

Figure 1:
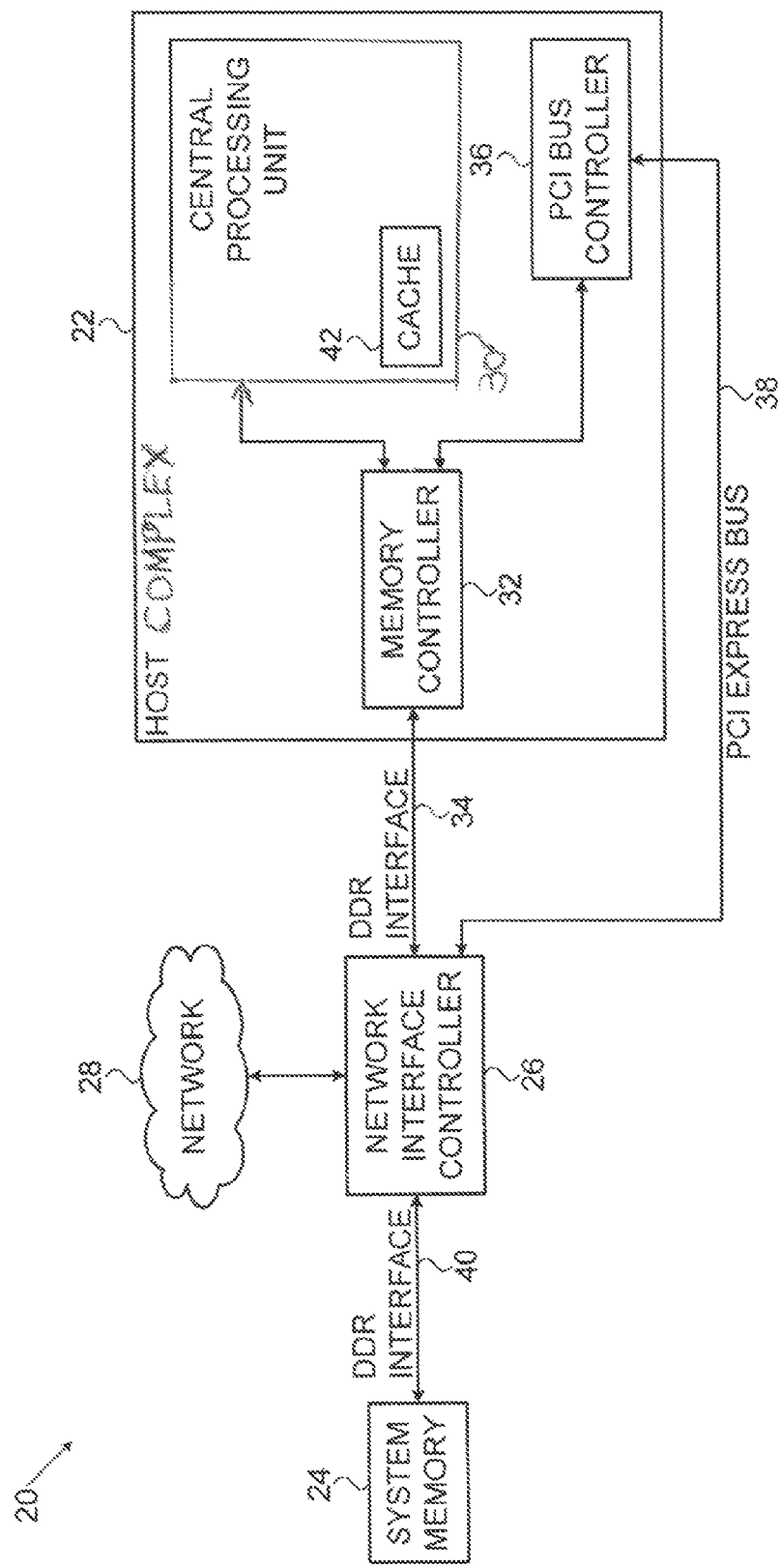
FIG. 1 is block diagram that schematically illustrates a host computer with enhanced data communication capabilities, in accordance with an embodiment of the present invention.

FIG. 1 is block diagram that schematically illustrates a host computer 20 with enhanced data communication capabilities, in accordance with an embodiment of the present invention. Computer 20 is a system that is typically embodied in a set of integrated circuit chips, mounted and interconnected on a suitable substrate. The computer comprises a host complex 22, a system memory 24 and a NIC 26, which connects the computer to a packet network 28, such as an Ethernet or InfiniBand switch fabric.

Host complex 22 and memory 24 may be of standard design. Memory 24 typically comprises DRAM, with a Double Data Rate (DDR) interface, such as a DDR type 3 or 4 interface. Memories of this sort are specified by the applicable JEDEC standards (available at www.jedec.org) and supported by all major manufacturers of DRAM. The term host complex refers to a central processing unit (CPU) 30 of computer 20 along with associated components, typically including a memory controller 32 and an expansion bus controller 36, which may be integrated with the CPU on a single integrated circuit chip or provided on one or more separate chips. CPU 30 communicates with memory 24 via memory controller 32, which typically has a DDR interface for this purpose. Alternatively, memory 24 and memory controller 32 may have memory interfaces of other sorts, which may be in accordance with any other applicable standard. In the present embodiment, however, it is assumed, for the sake of simplicity and clarity, that the components of computer 20 interact with memory 24 via DDR interfaces. Typically, CPU 30 also comprises at least one cache 42, which holds copies of data from memory 24 for low-latency access by the CPU, as is known in the art.

Expansion bus controller 36, such as a PCI bus controller, communicates via an expansion bus, such as a PCI Express bus 38, with input/output (I/O) and other peripheral devices in computer 20. In the present example, the only I/O device shown is NIC 26, while other devices that are typically coupled to bus 38 are omitted for the sake of simplicity.

In systems that are known in the art, memory controller 32 of host complex 22 is connected directly to system memory 24 via the respective DDR interfaces. In computer 20, however, NIC 26 is interposed between complex 22 and memory 24, so that all memory access operations by memory controller 32 pass through the NIC. For this purpose, NIC 26 includes a host memory interface 34, which connects to memory controller 32, and a system memory interface 40, which connects to memory 24, along with suitable internal circuits for pass-through of memory transactions carried out by host complex 22, as described further hereinbelow. Memory interfaces 34 and in this embodiment are DDR interfaces, for compatibility with the standard interfaces of host complex 22 and memory 24, but other suitable system memory interface may alternatively be used for this purpose.

Memory access by NIC 26 in connection with packet transmission and reception over network 28 likewise typically takes place directly through system memory interface 40, rather than over bus 38 as in systems that are known in the art. Bus 38 may still be used, however, for the exchange of control traffic between host complex and NIC 26, as well as data exchange for certain purposes. These control and data exchange functions are also explained further hereinbelow.

Figure 2:
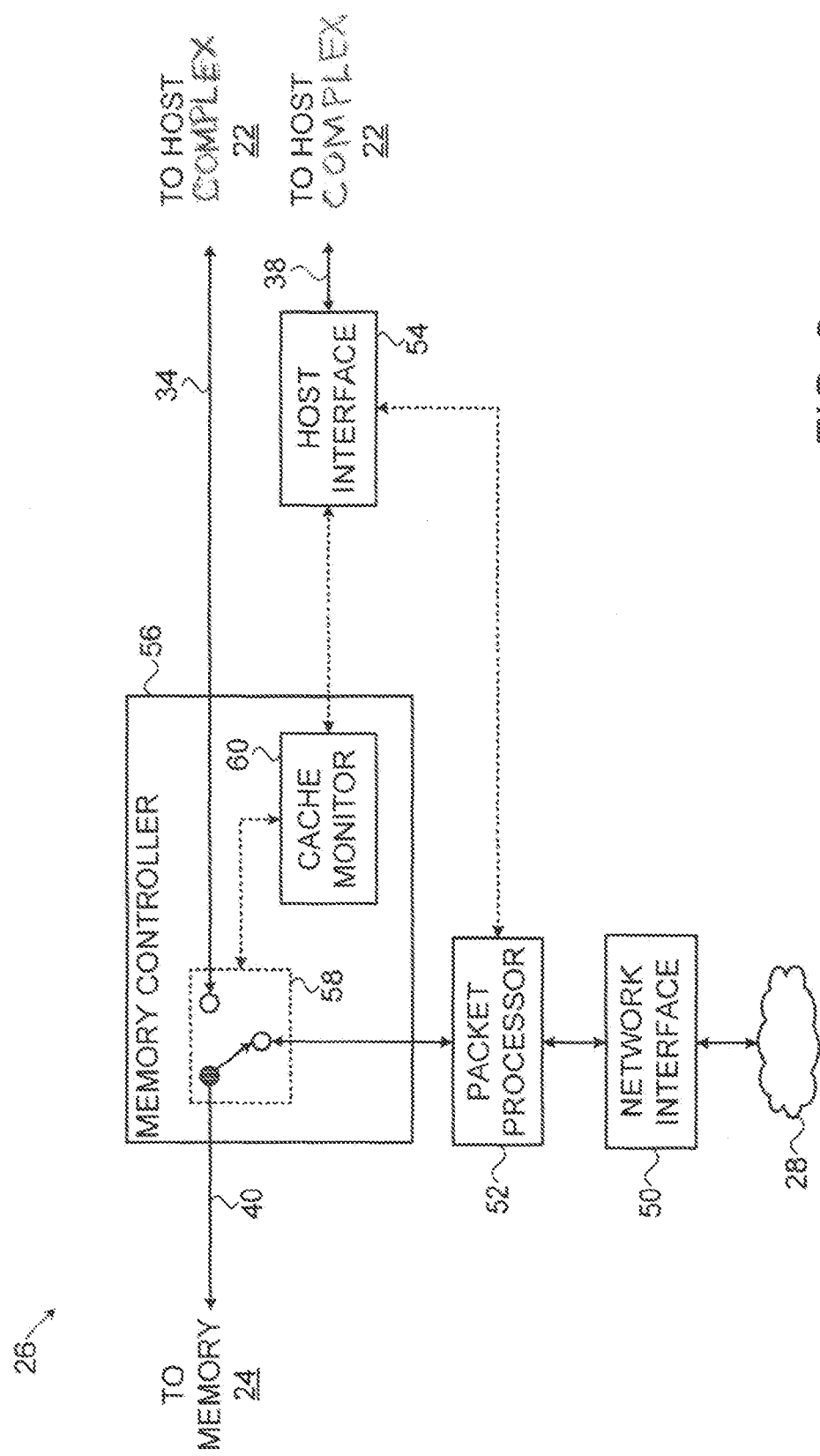
FIG. 2 is a block diagram that schematically illustrates a network interface controller, in accordance with an embodiment of the present invention.

FIG. 2 is a block diagram that schematically shows details of NIC 26, in accordance with an embodiment of the present invention. Typically, NIC 26 is produced as a single integrated circuit chip, incorporating all of the functions described herein. Alternatively, the functions of NIC 26 may be distributed among two or more separate chips, or as a further alternative may be integrated in a chip together with other components of computer 20, such as host complex 22. The description below relates specifically to the memory interface and data transfer functions of NIC 26 and omits other functions and circuit components for the sake of simplicity. These latter functions and circuit components may be implemented in a conventional manner that will be apparent to those skilled in the art.

NIC 26 comprises a network interface 50, which transmits and receives data packets to and from network 28. Packet processing logic 52 in NIC 26 generates the outgoing data packets for transmission to the network and processes the incoming data packets received from the network. These processing functions includes header generation and parsing, which are known in the art and are beyond the scope of the present disclosure. In addition, packet processing logic 52 transfers data to and from the payloads of the data packets transmitted and received via network interface 50 by direct memory access (DMA) from and to system memory 24. As explained earlier, unlike conventional systems in which this DMA data transfer is carried out via bus 38, the design of NIC 26 permits packet processor 52 to transfer data to and from memory 24 directly via memory interface 40.

For this latter purpose, NIC 26 comprises a memory controller 56, which contains all necessary circuitry to directly drive system memory 24, as well as to receive and service memory transactions initiated by host complex 22. As noted earlier, controller 56 is typically (although not necessarily) configured to operate in accordance with a DDR interface standard. Switching logic 58 in memory controller 56 alternately couples memory interface 40 to packet processing logic 52 for DMA operations or to memory interface 34 for pass-through operation to and from host complex 22. In the DMA configuration, NIC 26 is thus able to achieve high bandwidth and low latency in data transfer transactions between host computer 20 and network 28, which may be limited only by the wire speeds of the memory and network interfaces. In the pass-through configuration, memory controller 56 functions as a transparent channel, through which host complex 22 is able to access addresses in system memory 24 as though the system memory was connected directly to the host complex.

NIC 26 also comprises a host interface 54, which communicates with host complex 22 over PCI Express bus 38, or alternatively over another suitable control channel. Host interface 54 receives and transmits traffic over this channel that may include, for example, instructions from host complex 22 to packet processing logic 52 with respect to data packets that are to be transmitted to and/or received from network 28. Such instructions may be in the form of work items submitted by applications and other processes running on the host complex for execution by NIC 26. The work items may indicate, inter alia, addresses in memory 24 and possibly addresses in the memories of other nodes on network 28 between which the NIC is to transfer data. NIC 26 typically reads and writes the actual data, however, directly via interface 40, rather than via bus 38 as in systems that are known in the art.

Additionally or alternatively, the control traffic and/or data exchanged over bus 38 between host complex 22 and host interface 54 may be used in maintaining cache coherency between cache 42 of host complex 22 and system memory 24. For this purpose, host interface 54 may interact with cache monitoring logic 60, so that memory controller 56 is informed of changes made to ranges of data that are held in cache 42 by host complex 22. Based on this information, memory controller 56 keeps track of possible changes in data cached by the host complex in order to ensure that data read by NIC 26 from any address range in memory 24 is consistent with any copy of the same range that is concurrently held in cache 42.

Memory controller 56 in NIC 26 may cause memory controller 32 of host complex 22 to flush cache 42 to memory 24 if necessary before transferring the corresponding data to packet processing logic 52. Such a cache flush may be induced, for example, by initiating appropriate transactions on bus 38 via host interface 54, such as submitting a request from NIC 26 to read the data in question via bus 38, or by another suitable command. When this sort of cache-coherency approach is to be used, a certain address range in memory 24 may be configured as cacheable by CPU 30. To ensure that cache coherency is maintained, NIC 26 will then perform data transactions in this range via host interface 54 and bus 38, rather than via memory interface 40. Outside the preconfigured cacheable range, NIC 26 will still be able to access memory 24 directly via interface 40.

Additionally or alternatively, cache monitoring logic 60 may snoop data transfers between host complex 22 and system memory 24 in order to autonomously detect data access operations that may affect cache coherency, so that memory controller 56 is informed accordingly.

Although the description above relates, for the sake of clarity and conciseness, to a particular architecture of NIC 26 and particular interface and bus standards, the principles of the present invention may similarly be implemented using other buses, interfaces and internal NIC architectures. Such implementations will be apparent to those skilled in the art after reading the present description and are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A network interface device for a host computer, the device comprising:
   a network interface, configured to transmit and receive data packets to and from a network;
   packet processing logic, configured to transfer data to and from the data packets transmitted and received via the network interface by direct memory access (DMA) from and to a system memory of the host computer; and
   a memory controller, comprising:
      a first memory interface configured to be connected to the system memory;
      a second memory interface, configured to be connected to a host complex of the host computer; and
      switching logic, which alternately couples the first memory interface to the packet processing logic in a DMA configuration and to the second memory interface in a pass-through configuration,
      wherein the switching logic is configured, in the pass-through configuration, as a transparent channel, whereby the host complex accesses addresses in the system memory as though the system memory was connected directly to the host complex.

2. The device according to claim 1, wherein the system memory includes dynamic random access memory (DRAM), and wherein the first and second memory interface are Double Data Rate (DDR) interfaces.

3. The device according to claim 1, and comprising a host interface, which is configured to exchange traffic with the host complex via an expansion bus of the host computer, which is separate from the second memory interface.

4. The device according to claim 3, wherein the expansion bus comprises a peripheral component interconnect (PCI) bus.

5. The device according to claim 3, wherein the traffic exchanged with the host complex via the expansion bus comprises instructions to the packet processing logic with respect to the data packets that are transmitted to and received from the network.

6. A network interface device for a host computer, the device comprising:
   a network interface, configured to transmit and receive data packets to and from a network;
   packet processing logic, configured to transfer data to and from the data packets transmitted and received via the network interface by direct memory access (DMA) from and to a system memory of the host computer;
   a memory controller, comprising:
      a first memory interface configured to be connected to the system memory;
      a second memory interface, configured to be connected to a host complex of the host computer; and
      switching logic, which alternately couples the first memory interface to the packet processing logic in a DMA configuration and to the second memory interface in a pass-through configuration; and
   a host interface, which is configured to exchange traffic with the host complex via an expansion bus of the host computer, which is separate from the second memory interface,
   wherein the traffic exchanged with the host complex via the expansion bus comprises transactions on the expansion bus that are initiated by the memory controller in order to maintain cache coherency between the host complex and the system memory.

7. The device according to claim 6, wherein the switching logic is configured, in the pass-through configuration, as a transparent channel, whereby the host complex accesses addresses in the system memory as though the system memory was connected directly to the host complex.

8. A computer system, comprising:
a system memory;
a host complex; and
a network interface controller (NIC), which comprises:
 a network interface, configured to transmit and receive data packets to and from a network;
 packet processing logic, configured to transfer data to and from the data packets transmitted and received via the network interface by direct memory access (DMA) from and to the system memory; and
 a memory controller, comprising:
  a first memory interface connected to the system memory;
  a second memory interface connected to a host complex; and
  switching logic, which alternately couples the first memory interface to the packet processing logic in a DMA configuration and to the second memory interface in a pass-through configuration,
  wherein the switching logic is configured, in the pass-through configuration, as a transparent channel, whereby the host complex accesses addresses in the system memory as though the system memory was connected directly to the host complex.

9. The system according to claim 8, wherein the system memory comprises dynamic random access memory (DRAM), and wherein the first and second memory interface are Double Data Rate (DDR) interfaces.

10. The system according to claim 8, and comprising an expansion bus linked to the host complex, wherein the NIC comprises a host interface, which is coupled to exchange traffic with the host complex via the expansion bus and which is separate from the second memory interface.

11. The system according to claim 10, wherein the expansion bus comprises a peripheral component interconnect (PCI) bus.

12. The system according to claim 10, wherein the traffic exchanged with the host complex via the expansion bus comprises instructions to the packet processing logic with respect to the data packets that are transmitted to and received from the network.

13. A computer system, comprising:
a system memory;
a host complex;
an expansion bus linked to the host complex; and
a network interface controller (NIC), which comprises:
 a network interface, configured to transmit and receive data packets to and from a network;
 packet processing logic, configured to transfer data to and from the data packets transmitted and received via the network interface by direct memory access (DMA) from and to the system memory;
 a memory controller, comprising:
  a first memory interface connected to the system memory;
  a second memory interface connected to a host complex; and
  switching logic, which alternately couples the first memory interface to the packet processing logic in a DMA configuration and to the second memory interface in a pass-through configuration; and
 a host interface, which is coupled to exchange traffic with the host complex via the expansion bus and which is separate from the second memory interface,
 wherein the traffic exchanged with the host complex via the expansion bus comprises transactions on the expansion bus that are initiated by the memory controller in order to maintain cache coherency between the host complex and the system memory.

14. The system according to claim 13, wherein the switching logic is configured, in the pass-through configuration, as a transparent channel, whereby the host complex accesses addresses in the system memory as though the system memory was connected directly to the host complex.

15. A method for data communications, comprising:
connecting a first memory interface of a network interface controller (NIC) to a system memory of a host computer;
connecting a second memory interface of the NIC to a host complex of the host computer;
transmitting and receiving data packets to and from a network via a network interface of the NIC while transferring data, via packet processing logic in the NIC, to and from the data packets by direct memory access (DMA) between the packet processing logic and the system memory; and
alternately coupling the first memory interface to the packet processing logic in a DMA configuration to enable transfer of the data between the packet processing logic and the system memory, and to the second memory interface in a pass-through configuration to enable direct data transfer between the host complex and the system memory,
wherein coupling the first memory interface to the second memory interface in the pass-through configuration comprises providing a transparent channel, over which the host complex accesses addresses in the system memory as though the system memory was connected directly to the host complex.

16. The method according to claim 15, wherein the system memory includes dynamic random access memory (DRAM), and wherein the first and second memory interface are Double Data Rate (DDR) interfaces.

17. The method according to claim 15, and comprising connecting a host interface of the NIC to exchange traffic with the host complex via an expansion bus of the host computer, which is separate from the second memory interface.

18. The method according to claim 17, wherein the expansion bus comprises a peripheral component interconnect (PCI) bus.

19. The method according to claim 17, wherein connecting the host interface comprises receiving, via the expansion bus, instructions sent from the host complex to the packet processing logic with respect to the data packets that are transmitted to and received from the network.

20. A method for data communications, comprising:
connecting a first memory interface of a network interface controller (NIC) to a system memory of a host computer;
connecting a second memory interface of the NIC to a host complex of the host computer;
transmitting and receiving data packets to and from a network via a network interface of the NIC while transferring data, via packet processing logic in the NIC, to and from the data packets by direct memory access (DMA) between the packet processing logic and the system memory;

alternately coupling the first memory interface to the packet processing logic in a DMA configuration to enable transfer of the data between the packet processing logic and the system memory, and to the second memory interface in a pass-through configuration to enable direct data transfer between the host complex and the system memory; and connecting a host interface of the NIC to exchange traffic with the host complex via an expansion bus of the host computer, which is separate from the second memory interface, wherein connecting the host interface comprises initiating transactions on the expansion bus between the memory controller and the host complex in order to maintain cache coherency between the host complex and the system memory.

21. The method according to claim 20, wherein coupling the first memory interface to the second memory interface in the pass-through configuration comprises providing a transparent channel, over which the host complex accesses addresses in the system memory as though the system memory was connected directly to the host complex.

\* \* \* \* \*